(12) United States Patent
Matsumoto et al.

(10) Patent No.: US 9,590,212 B2
(45) Date of Patent: Mar. 7, 2017

(54) ORGANIC EL DISPLAY DEVICE AND METHOD FOR MANUFACTURING THE ORGANIC EL DISPLAY DEVICE

(71) Applicant: Japan Display Inc., Tokyo (JP)

(72) Inventors: Yuko Matsumoto, Tokyo (JP); Hirotsugu Sakamoto, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/499,467

(22) Filed: Sep. 29, 2014

(65) Prior Publication Data

US 2015/0090989 A1   Apr. 2, 2015

(30) Foreign Application Priority Data

Sep. 30, 2013   (JP) ................................. 2013-203361

(51) Int. Cl.

| H01L 29/08 | (2006.01) |
|---|---|
| H01L 35/24 | (2006.01) |
| H01L 51/00 | (2006.01) |
| H01L 51/56 | (2006.01) |
| H01L 27/32 | (2006.01) |
| H01L 51/52 | (2006.01) |

(52) U.S. Cl.
CPC .......... H01L 51/56 (2013.01); H01L 27/3246 (2013.01); H01L 27/3279 (2013.01); H01L 51/5228 (2013.01)

(58) Field of Classification Search
CPC ............. H01L 27/3276; H01L 27/3246; H01L 51/5228; H01L 2251/5315; H01L 51/5203; H01L 2227/323; H01L 27/124; H01L 27/3248; H01L 51/5234; H01L 51/56; H01L 27/1214; H01L 27/1248; H01L 27/3244; H01L 27/326; H01L 51/5221
USPC ............... 257/59, 72, 40, E21.158, E21.409, 257/E29.003, E33.012, E33.053, 257/E51.018, 83; 438/34, 29
See application file for complete search history.

(56) References Cited

U.S. PATENT DOCUMENTS

| 2004/0160170 A1 | 8/2004 | Sato et al. | |
|---|---|---|---|
| 2005/0179374 A1* | 8/2005 | Kwak | ........................... 313/506 |
| 2009/0011677 A1* | 1/2009 | Ikeda et al. | ..................... 445/24 |

(Continued)

FOREIGN PATENT DOCUMENTS

| JP | 2004-207217 A | 7/2004 |
|---|---|---|
| JP | 2011-221203 A | 11/2011 |

*Primary Examiner* — Thao X Le
*Assistant Examiner* — Nduka Ojeh
(74) *Attorney, Agent, or Firm* — Typha IP LLC

(57) ABSTRACT

An organic EL display device includes a first organic layer that is arranged between lower electrodes and an upper electrode, and formed of a plurality of layers including a light emitting layer, a laminated auxiliary line that has a first auxiliary line and a second auxiliary line, and laminated on each other in order, and extend in one direction between two of pixels adjoining each other, and a second organic layer that is formed of a plurality of the same layers as the first organic layer, and arranged in contact with the first auxiliary line in a connection hole opened in the second auxiliary line so as to come out of contact with the first organic layer, in which the upper electrode is arranged in contact with the first auxiliary line around the second organic layer so as to embed the connection hole.

15 Claims, 7 Drawing Sheets

(56) References Cited

U.S. PATENT DOCUMENTS

| | | | |
|---|---|---|---|
| 2009/0309493 A1* | 12/2009 | Seo | H01L 27/3246 313/506 |
| 2010/0051958 A1* | 3/2010 | Izumida et al. | 257/72 |
| 2010/0244664 A1* | 9/2010 | Fujioka et al. | 313/504 |
| 2011/0215329 A1* | 9/2011 | Chung | 257/59 |
| 2012/0007083 A1* | 1/2012 | You et al. | 257/59 |
| 2013/0256638 A1* | 10/2013 | Uesugi | H01L 51/5228 257/40 |

* cited by examiner

ORGANIC EL DISPLAY DEVICE AND METHOD FOR MANUFACTURING THE ORGANIC EL DISPLAY DEVICE

CROSS-REFERENCE TO RELATED APPLICATION

The present application claims priority from Japanese application JP2013-203361 filed on Sep. 30, 2013, the content of which is hereby incorporated by reference into this application.

BACKGROUND OF THE INVENTION

1. Field of the Invention

The present invention relates to an organic EL display device, and a method for manufacturing the organic EL display device, and more particularly to an organic EL display device and a method for manufacturing the same that allow light emitting elements which are self-emitting bodies arranged in respective pixels to emit light for display.

2. Description of the Related Art

In recent years, an image display device (hereinafter referred to as "organic EL (electro-luminescent) display device") using self-emitting bodies called "organic light emitting diodes (OLED)" has been put into a practical use. As compared with a liquid crystal display device in a related art, the organic EL display device uses the self-emitting bodies, and therefore not only is excellent in visibility and response speed, but also does not require an auxiliary lighting device such as backlight. As a result, the organic EL display device can be further thinned.

In a so-called "top emission type display device" in which a light is emitted on a side of an insulating substrate where light emitting elements are formed, in an upper electrode and a lower electrode which are two electrodes that sandwich an organic layer having at least one light emitting layer therebetween, the upper electrode is an electrode that covers the respective pixels in a display area on which the organic layer is formed, and made of a transparent conductive material. It is desirable to more thin the upper electrode for the purpose of improving the transmittance of light. However, a resistance value increases more as the upper electrode is thinner, resulting in a voltage drop. As a result, uneven brightness is likely to be generated in an end and a center of the display area.

JP 2004-207217 A discloses that the upper electrode is brought into contact with an auxiliary electrode of the same layer as that of the lower electrode within the display area through a contact hole to decrease a resistance of the upper electrode. JP 2011-221203 A discloses that the upper electrode is electrically connected to a conductive substrate through the connection hole within the display area.

SUMMARY OF THE INVENTION

As disclosed in the above JP 2004-207217 A and JP 2011-221203 A, that the upper electrode is brought into contact with the metal electrode high in conductivity within the display area is effective in reducing the resistance of the upper electrode and equalizing the potential. However, in any cases, because the connection hole is required in the organic layer, taking a deposition accuracy of the organic layer formed with the use of a deposition mask into account, it is difficult to open a high precision hole, and the connection holes opened in the respective pixels have a certain degree of size. However, this leads to a reduction in an area of the portion that emits light, and a contrast reduction of display. In particular, in the organic EL display device having an organic layer that covers the respective pixels in the display area without using the deposition mask, it is difficult to provide the connection hole within the display area.

The present invention has been made in view of the above circumstances, and aims at providing an organic EL display device that improves an uniformity of the potential of the upper electrode with reducing the contrast reduction of display.

According to the present invention, there is provided an organic EL display device, including: lower electrodes that are arranged in each of pixels within a display area, made of a conductive material, and controlled in potential for each of the pixels; an upper electrode that is arranged to cover the pixels, and made of a conductive material; a first organic layer that is arranged between the lower electrodes and the upper electrode, and formed of a plurality of layers including a light emitting layer which is made of an organic material that emits light; a laminated auxiliary line that has at least a first auxiliary line and a second auxiliary line made of a conductive material, and laminated on each other in order, and extends in one direction between two of the pixels adjoining each other within the display area; and a second organic layer that is formed of a plurality of the same layers as the first organic layer, and arranged in contact with the first auxiliary line in a connection hole opened in the second auxiliary line so as to come out of contact with the first organic layer, in which the upper electrode is arranged in contact with the first auxiliary line around the second organic layer so as to embed the connection hole.

Also, the organic EL display device according to the present invention may further include: a planarization film that is made of an organic material which covers a circuit having a thin film transistor formed on a substrate; and an insulating bank that covers ends of the lower electrodes of the two of the pixels, and electrically isolates between the two of the pixels, in which the laminated auxiliary line may be formed on the planarization film, and the upper electrode may come in contact with the first auxiliary line through the connection hole opened in the insulating bank.

Also, the organic EL display device according to the present invention may further include: a metal line that extends between the two of the pixels within the display area; a planarization film that is made of an organic material which covers the metal line; and an insulating bank that covers ends of the lower electrodes of the two of the pixels, and electrically isolates between the two of the pixels, in which the laminated auxiliary line may be formed on the metal line, and the upper electrode may come in contact with the first auxiliary line through the connection hole opened in the planarization film and the insulating bank.

Also, in the organic EL display device according to the present invention, the lower electrodes may have the same laminated structure as that of the laminated auxiliary lines.

Also, in the organic EL display device according to the present invention, the laminated auxiliary line may have a structure in which a third auxiliary line is laminated in addition to the first auxiliary line and the second auxiliary line, and the connection hole may be opened at a position of the third auxiliary line corresponding to a position opened in the second auxiliary line.

Also, in the organic EL display device according to the present invention, a material of the third auxiliary line may be identical with a material of the first auxiliary line.

Also, in the organic EL display device according to the present invention, the first auxiliary line may be made of ITO (indium tin oxide), and the second auxiliary line may be made of Ag.

In the organic EL display device according to the present invention, the first organic layer may have the same light emitting layer in all of the pixels within the display area.

According to the present invention, there is provided a method for manufacturing an organic EL display device, including the steps of: forming an first auxiliary line and a second auxiliary line each made of a conductive material in order as a laminated auxiliary line forming step; overetching the second auxiliary line to form a connection hole, and expose the first auxiliary line as an overetching step; forming a first organic layer that is formed of a plurality of layers including a light emitting layer made of an organic material which emits light, and a second organic layer that is arranged on the first auxiliary line through the connection hole, and is discontinuous to the first organic layer at the same time as an organic layer forming step; and forming an upper electrode that is made of a conductive material, comes in contact with the first auxiliary line through the connection hole, and covers pixels as an upper electrode forming step, after the organic layer forming step.

Also, in the method for manufacturing an organic EL display device according to the present invention, the laminated auxiliary line forming step may include a step of further forming a third auxiliary line in a position other than that corresponding to the connection hole of the second auxiliary line.

Also, the method for manufacturing an organic EL display device according to the present invention may further include the steps of: forming a planarization film made of an organic material as a planarization film forming step; and forming lower electrodes for each of pixels on the planarization film as a lower electrode forming step, in which the lower electrodes may have the same layer structure as that of the laminated auxiliary lines, and the lower electrode forming step may be the same step of the laminated auxiliary line forming step, and implemented at the same time.

Also, the method for manufacturing an organic EL display device according to the present invention may further include the steps of: forming a metal line between two of the pixels adjoining each other as a metal line forming step; forming an insulating film made of an insulating material so as to cover a display area after the metal line forming step as an insulating film forming step; and forming a contact hole from which at least a part of the metal line is exposed, in the insulating film as a contact hole forming step, in which in the laminated auxiliary line forming step, the first auxiliary line and the second auxiliary line may be formed on the metal line through the contact hole.

Also, in the method for manufacturing an organic EL display device according to the present invention, the organic layer forming step may include a step of forming the organic layer through a vapor deposition technique, and the upper electrode forming step may include a step of forming the upper electrode through a sputtering technique.

DETAILED DESCRIPTION OF THE INVENTION

Figure 1:
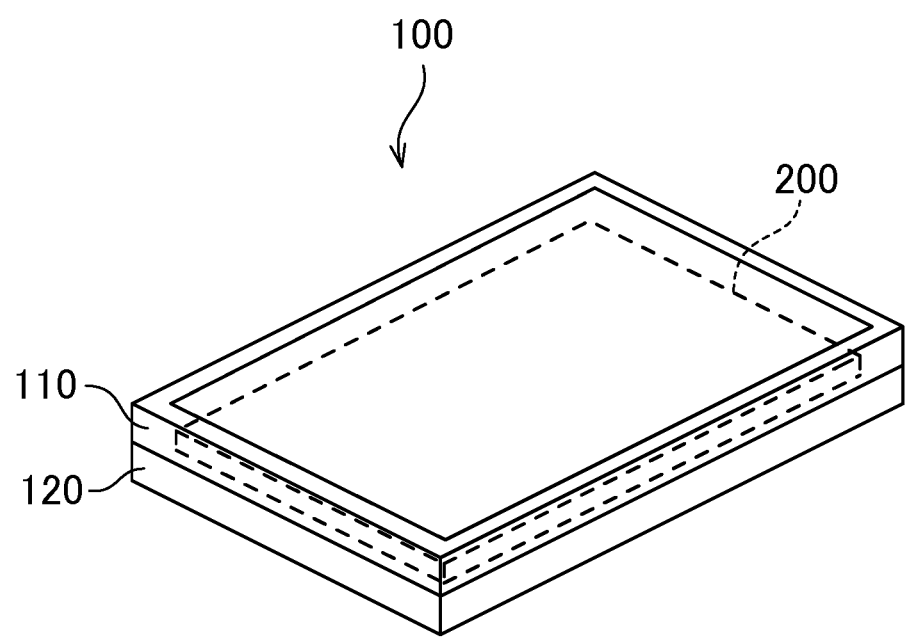
FIG. 1 is a diagram schematically illustrating an organic EL display device according to an embodiment of the present invention.

Hereinafter, an embodiment of the present invention will be described with reference to the accompanying drawings. In the drawings, the same or equivalent elements are denoted by identical symbols, and a repetitive description will be omitted.

FIG. 1 is a diagram schematically illustrating an organic EL display device 100 according to an embodiment of the present invention. As illustrated in FIG. 1, the organic EL display device 100 includes an organic EL panel 200 fixed to be sandwiched between an upper frame 110 and a lower frame 120.

Figure 2:
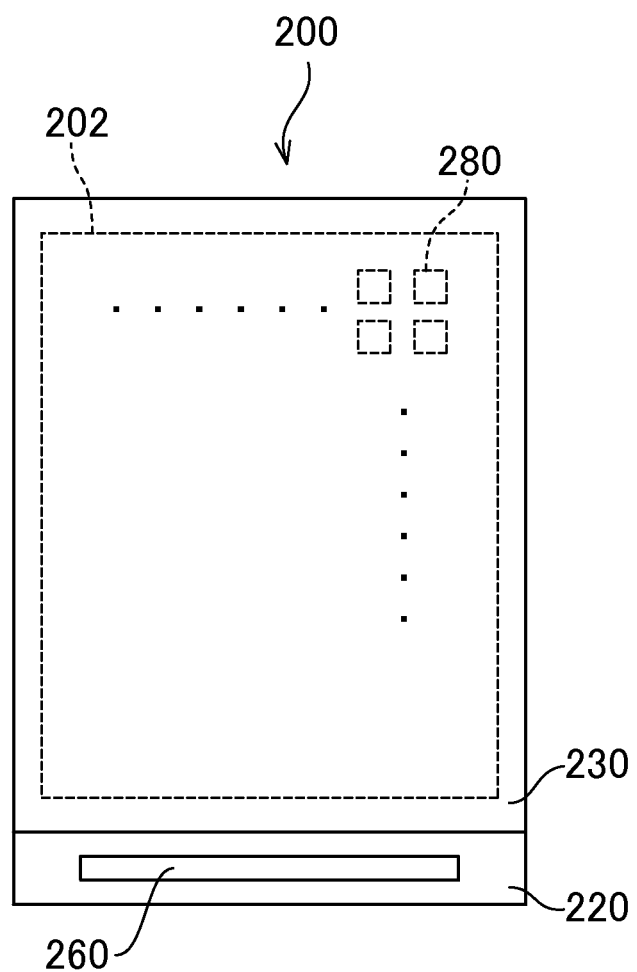
FIG. 2 is a diagram illustrating a configuration of an organic EL panel in FIG. 1.

FIG. 2 illustrates a configuration of the organic EL panel 200 in FIG. 1. The organic EL panel 200 includes two substrates of a TFT (thin film transistor) substrate 220 and a sealing substrate 230, and a space between those substrates 220 and 230 is filled with a transparent resin not shown. The TFT substrate 220 has pixels 280 arranged in a matrix in a display area 202. Also, a drive IC (integrated circuit) 260 that is a drive circuit which applies a potential for performing a conduction between a source and a drain to a scanning signal line (not shown) of a pixel transistor arranged in each of the pixels, and also applies a voltage corresponding to a gradation value of the pixel to a data signal line of each pixel transistor is mounted on the TFT substrate 220.

Figure 3:
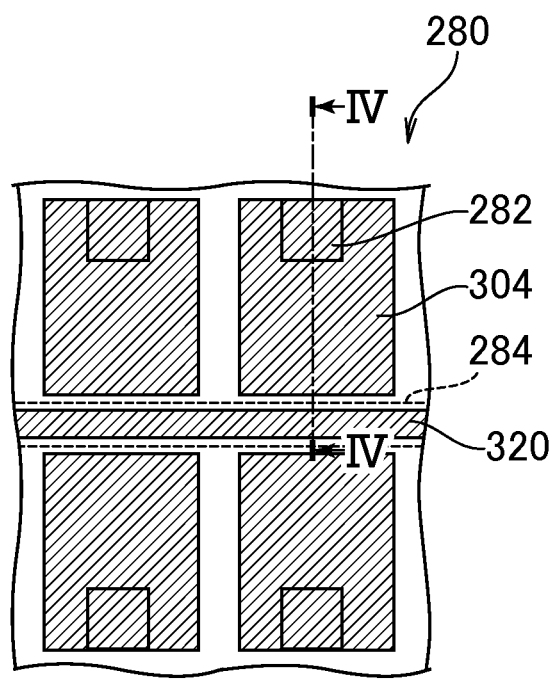
FIG. 3 is an enlarged diagram schematically illustrating four pixels in FIG. 2.

FIG. 3 is an enlarged view schematically illustrating four of the pixels 280 in FIG. 2. As illustrated in FIG. 3, each of the pixels 280 includes a lower electrode 304 that is disposed for each pixel 280, independently, and a lower electrode contact hole 282 that connects the lower electrode 304 to a source/drain electrode 309 which will be described later. Although will be described later, a first organic layer 306 including alight emitting layer arranged over a substantially overall surface of the display area 202, and an upper electrode 307 arranged on an overall display area thereon are arranged over the lower electrode 304 in the stated order. A laminated auxiliary line 320 that is formed in the same process as that of the lower electrode 304 at the same time is arranged between the respective pixels 280, and a metal line 284 used for light emission control is disposed further below the laminated auxiliary line 320 (glass substrate 301 side). The laminated auxiliary line 320 is connected to a line for applying the potential of the upper electrode 307 outside of the display area 202.

Figure 4:
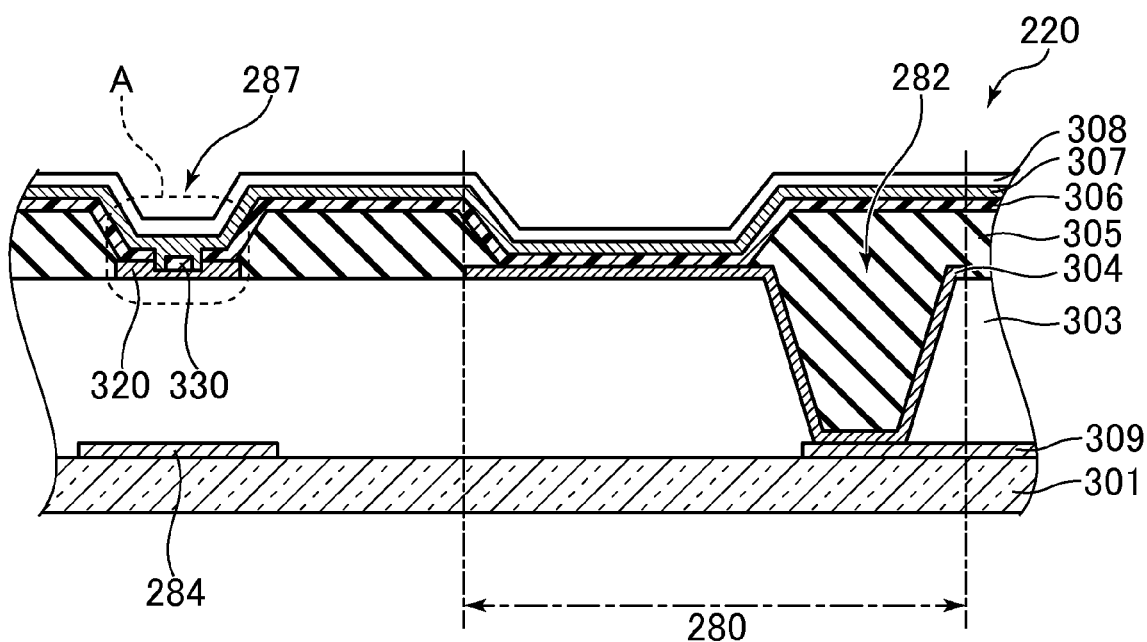
FIG. 4 is a cross-sectional view taken along a line IV-IV in FIG. 3.

FIG. 4 is a cross-sectional view taken along a line IV-IV in FIG. 3. As illustrated in FIG. 4, the TFT substrate 220 includes the glass substrate 301 which is an insulating substrate, the source/drain electrode 309 and the metal electrode 284 which are made of a conductive material and formed on the glass substrate 301, a planarization film 303 that is made of an insulating material and formed on the source/drain electrode 309 and the metal line 284, the lower electrode 304 that is connected to the source/drain electrode 309 through a contact hole opened in the planarization film 303, an insulating bank 305 that covers an end of the lower electrode 304, and isolates the respective electrodes from each other between the adjacent pixels, the first organic layer 306 including a common layer such as a light emitting layer, an electron injection layer, or a hole transport layer, which is formed over the lower electrode 304 and the insulating bank 305 so as to cover the substantially overall display area 202, the upper electrode 307 that is formed on the first organic layer 306 so as to cover the overall display area 202, a sealing film 308 that blocks air and water for the purpose of preventing the first organic layer 306 from being deteriorated, the laminated auxiliary line 320 that has the same layer structure as that of the lower electrode 304, and is formed between the respective pixels, and a second organic layer 330 that is formed on the laminated auxiliary line 320. Although not shown, the source/drain electrode 309 is connected to a TFT formed in each of the pixels 280 between the glass substrate 301 and the planarization film 303. The light emitting layer of the first organic layer emits light when holes or electrons injected from the lower electrode 304 are recombined with electrons or holes injected from the upper electrode 307, and an excited state is formed, and shifted to a ground state.

As illustrated in FIG. 4, the upper electrode 307 comes in contact with the laminated auxiliary line 320 arranged between the respective pixels 280 through a connection hole 287. The upper electrode 307 that has been thinly formed within the display area 202, resulting in an increase in resistance value can come in contact with the laminated auxiliary line 320 high in conductivity within the display area 202. For that reason, a potential of the upper electrode 307 is kept constant within the display area 202. The second organic layer 330 is arranged in a part of an area in which the connection hole 287 is formed on the laminated auxiliary line 320.

The organic EL display device 100 according to this embodiment is an organic EL display device of a type in which the light of a uniform wavelength region (for example, W (white) is emitted over the overall display area, and a light of the wavelength region corresponding to RGB is extracted by a color filter disposed on the sealing substrate 230. However, the present invention is not limited to this configuration, but may be an organic EL display device of a type in which the light of the respective wavelength regions of RGB are emitted in the respective pixels, and the light is extracted without using the color filter. In this case, the first organic layer and the second organic layer including the light emitting layer are painted in a dot shape or a stripe shape for each of the pixels through vapor deposition.

Figure 5:
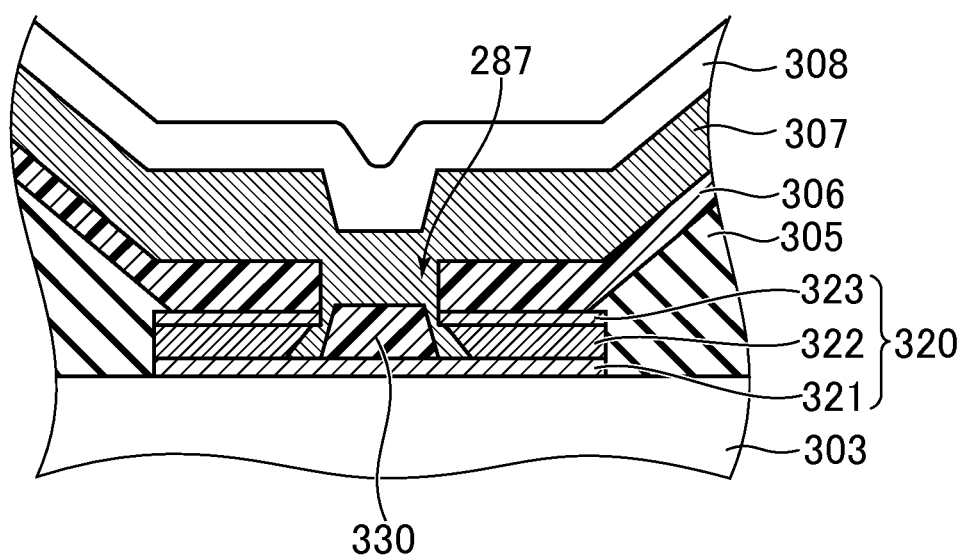
FIG. 5 is an enlarged view illustrating a portion A in FIG. 4.

FIG. 5 is an enlarged view illustrating a portion A in FIG. 4. As illustrated in FIG. 5, the laminated auxiliary line 320 includes a first auxiliary line 321 that is made of ITO (indium tin oxide) which is a transparent electrode, a second auxiliary line 322 that is made of Ag, and a third auxiliary line 323 that is made of ITO. Although not shown, the lower electrode 304 also has the same laminated structure as that of the laminated auxiliary line 320. The first auxiliary line 321 has a line width of the laminated auxiliary line 320, and the second auxiliary line 322 and the third auxiliary line 323 have the connection hole 287 in the center thereof, and the second auxiliary line 322 is shaped to be internally hollowed more than the third auxiliary line 323 by overetching.

The first organic layer 306 is divided by the connection hole 287, and the second organic layer 330 is spaced apart from the first organic layer 306, and arranged on the first auxiliary line 321 in the connection hole 287. Because the upper electrode 307 is arranged to cover a periphery of the second organic layer 330 and embed the connection hole 287, the upper electrode 307 comes in contact with the first auxiliary line 321. In this embodiment, the combination of the third auxiliary line 323/the second auxiliary line 322/the first auxiliary line 321 is set to ITO/Ag/ITO. Alternatively, the combination may be set to Ti/Al/Ti or Mo/W/Ti, or the combination of the second auxiliary line 322/the first auxiliary line 321 without provision of the third auxiliary line 323 may be set as the combination of ITO/Al.

Figure 6:
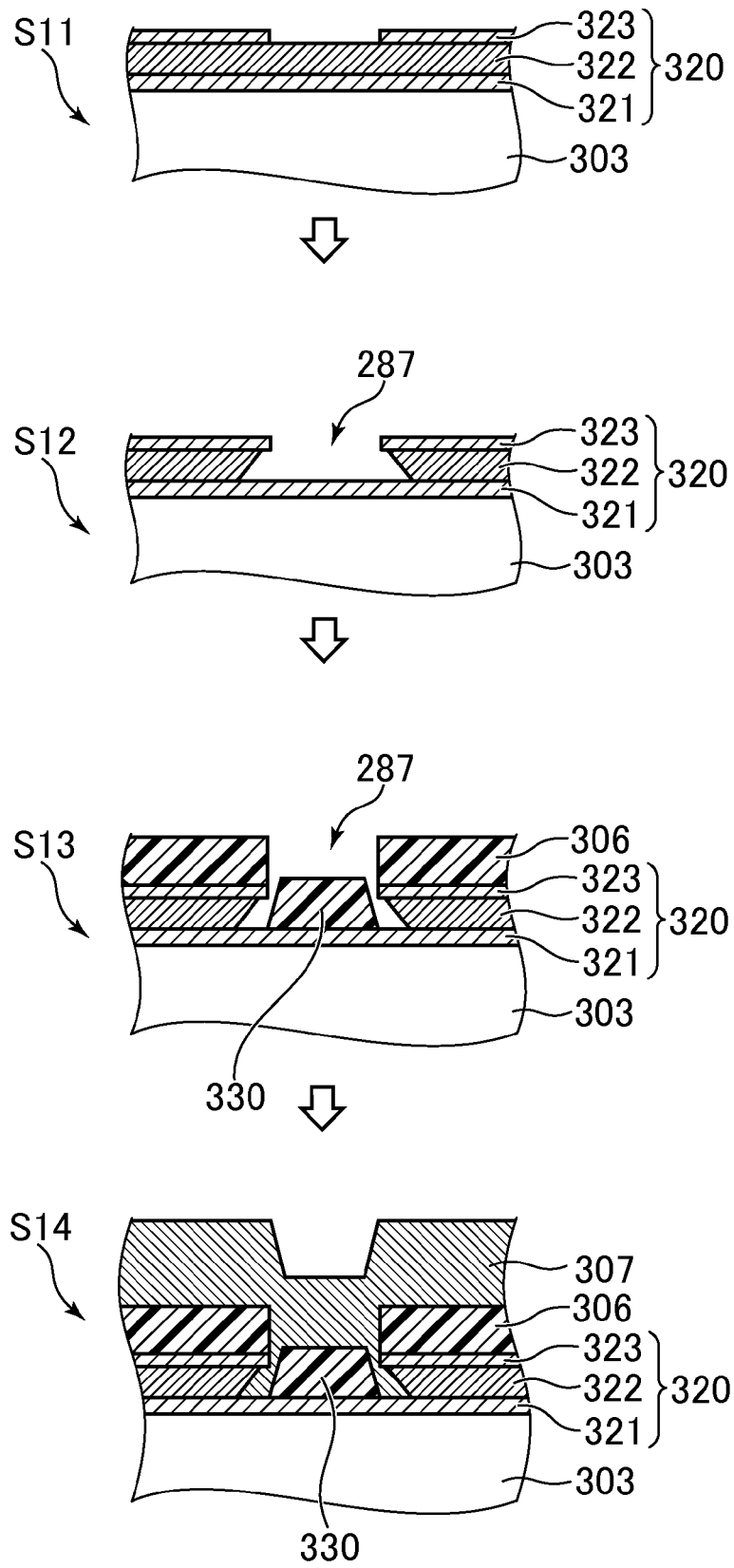
FIG. 6 is a diagram illustrating a process of forming an upper electrode formed in a connection hole.

FIG. 6 is a diagram illustrating a process of forming the upper electrode 307 formed in the connection hole 287. In this process, first, in a laminated auxiliary line forming step S11, the laminated auxiliary line 320 is formed on the planarization film 303. In this example, the laminated auxiliary line 320 is of a structure in which the first auxiliary line 321, the second auxiliary line 322, and the third auxiliary line 323 are laminated on each other in the stated order. The third auxiliary line 323 is formed on only both sides thereof along a direction of extending the laminated auxiliary line, and not formed in a center portion thereof, and the second auxiliary line 322 is exposed from the center portion. In this embodiment, it is desirable that the first auxiliary line 321 is formed of an ITO layer, and formed in 10 nm to 100 nm through a sputtering technique or a vapor deposition technique. It is desirable that the second auxiliary line 322 is formed of an Ag layer, and formed in 50 nm to 500 nm through the sputtering technique or the vapor deposition technique. It is desirable that the third auxiliary line 323 is formed of an ITO layer, and formed in 5 nm to 100 nm through the sputtering technique or the vapor deposition technique. Although not shown, the lower electrode 304 within the pixels 280 also has the same laminated structure as that of the laminated auxiliary line 320, and is formed at the same time as the laminated auxiliary line forming step S11.

Sequentially, in an etching step S12, an exposed portion of the second auxiliary line 322 is wet-etched. When the product is immersed in an etching solution, not only the exposed portion but also a part of a portion covered with the third auxiliary line 323 is dissolved into a shape illustrated in FIG. 6. Then, although not shown, the insulating bank 305 is formed in each of the pixels 280. It is desirable that an end of the laminated auxiliary line 320 on the pixel 280 side is also covered with the insulating bank 305. This step can be implemented at the same time as the step of forming the insulating bank 305 within the pixel 280. In this case, the etching solution of the insulating bank 305 may be mixed with an etching solution of the second auxiliary line 322, for example, Ag for etching. A contact hole is formed between two adjacent pixels as the connection hole 287.

In an organic layer forming step S13, the first organic layer 306 and the second organic layer 330 are formed through vapor deposition at the same time. In this situation, the first organic layer 306 and the second organic layer 330 are formed through the vapor deposition at the same time. However, because an organic material heated in a vacuum adheres to those layers with directivity, the first organic layer 306 formed on the third auxiliary line 323, and the second organic layer 330 formed on the first auxiliary line 321 are formed as a discontinuous layer (disconnection structure) due to a large step in the connection hole 287. In this embodiment, the first and second organic layers that emit the same W (white) color in all of the pixels are formed. In this embodiment, the first organic layer 306 and the second organic layer 330 are formed through vapor deposition. Alternatively, the first organic layer 306 and the second organic layer 330 can be formed by a forming method in which a discontinuous layer is formed with the provision of a step such as an offset printing.

Finally, in an upper electrode forming step S14, the upper electrode 307 is formed by a transparent electrode made of InZnO (Indium Zinc Oxide) through the sputtering technique. The transparent electrode formed through the sputtering technique is higher in deposition than the organic material. For that reason, the transparent electrode also adheres to the discontinues portion between the first organic layer 306 and the second organic layer 330, and is formed as the continuous upper electrode 307 that comes in contact with the first auxiliary line 321 and the second auxiliary line 322. In a subsequent step, a sealing film is made of SiN or glass cap, but a detailed description will be omitted because of a known process.

As has described above, in this embodiment, because the upper electrode 307 can come in contact with the laminated auxiliary line 320 low in resistance value in the display area 202, a sheet resistance of the upper electrode 307 can be reduced, and the power consumption can be reduced. Also, in the display area 202, because a partial voltage drop is not generated, the uniformity of display can be kept. Further, because the upper electrode 307 can come in contact with the laminated auxiliary line 320 without patterning the first organic layer and the second organic layer, the number of steps does not increase. Also, a larger area of the light emission area of the pixels can be kept, and high definition pixels can be provided. Also, because the laminated auxiliary line 320 can be formed in the same process as that of the lower electrode 304 at the same time, the number of manufacturing steps does not increase. Also, because the first organic layer is cut off by the connection hole 287, a current leakage between the pixels through the first organic layer is suppressed, and an electric color mixture can be suppressed. Also, a leakage light that enters the insulating bank 305 by horizontal emission is not output without passing through interfaces of a large number of layers. For that reason, the optical color mixture can be also suppressed. This embodiment can be effectively applied to the organic EL display device having the organic layer including the light emission layer or the common layer formed on the overall display area 202, but can be also applied to an organic EL display device having light emission layers different in the wavelength region of the emitted light from each other.

In this embodiment, the connection hole 287 is formed in only one direction between the pixels. Alternatively, the connection hole 287 extending into a lattice shape in two directions of vertical and horizontal directions may be formed. With this formation, because an independent discontinuous layer (disconnected structure) is formed for each of the pixels 280, the electric color mixture and the optical color mixture can be more suppressed.

Figure 7:
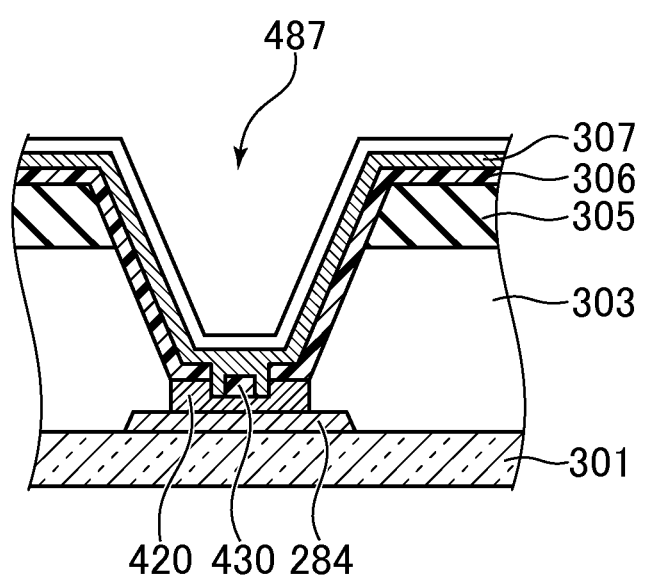
FIG. 7 is a diagram illustrating a modification of this embodiment.

FIG. 7 is a diagram illustrating a modification of the above embodiment, which illustrates a cross-section of a portion in which the upper electrode 307 is connected to the metal line 284 within the display area 202. In this modification, after a through-hole 487 has been formed in the planarization film 303, a laminated auxiliary line 420, the first organic layer 306, and a second organic layer 430 are formed over the metal line 284 formed on the glass substrate 301 through the through-hole 487. Because the configuration is identical with that in the above embodiment except for the through-hole 487 formed in the planarization film 303, a detailed description will be omitted. In this case, the metal line 284 is connected to the line for applying the potential to the upper electrode 307. Also, in this modification, the metal line 284 formed on the glass substrate 301 may be formed not on the glass substrate 301, but through an insulating film.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An organic EL display device, comprising:
lower electrodes including at a first layer and a second layer;
an upper electrode overlapping the lower electrode;
a first organic layer arranged between the lower electrodes and the upper electrode;
a laminated auxiliary line including a first auxiliary line located in the same layer as the first layer and a second auxiliary line located in the same layer as the second layer; and
a second organic layer formed of the same layer as the first organic layer,
wherein
the second auxiliary line contacts with the first auxiliary line directly,
a first connection hole is formed in the second auxiliary line,
the second organic layer is located in the first connection hole, contacts with the first auxiliary line, and is out of contact with the first organic layer,
the upper electrode is formed in a gap between the first organic layer and the second organic layer,
the first auxiliary line is in contact with the upper electrode,
the lower electrode and the laminated auxiliary line do not overlap with each other, and
the upper electrode includes a portion in direct contact with an upper surface of the first auxiliary line.

2. The organic EL display device according to claim 1, wherein the laminated auxiliary line is longer than the lower electrode in a plan view.

3. The organic EL display device according to claim 2, wherein a second connection hole is formed in the first organic layer and
the second connection hole overlaps the first connection hole.

4. The organic EL display device according to claim 3, wherein the second connection hole has an inclined surface.

5. The organic EL display device according to claim 4, wherein the laminated auxiliary line includes a third auxiliary line,
the third auxiliary line is formed between the first organic layer and the second auxiliary line,
the first connection hole has a bottom opening on a side toward the first auxiliary line and a top opening on a side toward the third auxiliary line,
the bottom opening is larger than the top opening.

6. The organic EL display device according to claim 2, wherein the upper electrode is formed in a gap between the second organic layer and the second auxiliary line.

7. The organic EL display device according to claim 2, comprising a planarization film,
wherein a gap between the planarization film and the second organic layer is smaller than a gap between the planarization film and the first organic layer.

8. The organic EL display device according to claim 2, wherein the upper electrode has a concave portion and the concave portion overlaps the second organic layer.

9. The organic EL display device according to claim 8, wherein the concave portion does not overlap the first organic layer.

10. The organic EL display device according to claim 2, wherein the laminated auxiliary line includes a third auxiliary line and
the third line is formed between the first organic layer and the second auxiliary line.

11. The organic EL display device according to claim 10, wherein a third connection hole is formed in the third auxiliary line and
the third connection hole overlaps the second connection hole.

12. The organic EL display device according to claim 1, wherein
the second auxiliary line includes an inner surface facing the inside of the first connection hole, and
the inner surface of the second auxiliary line is inclined so that the width of the first connection hole increases toward the first auxiliary line.

13. The organic EL display device according to claim 1, wherein
the second auxiliary line includes an inner surface facing the inside of the first connection hole
a gap is formed between the inner surface of the second auxiliary line and the second organic layer, and
an upper surface of the first auxiliary line includes a portion exposed upward in the gap.

14. The organic EL display device according to claim 1, wherein
the second auxiliary line includes an inner surface facing the inside of the first connection hole,
a gap is formed between the inner surface of the second auxiliary line and the second organic layer,
the upper electrode includes a portion formed in the gap between the first organic layer and the second organic layer and formed in the gap formed between the inner surface of the second auxiliary line and the second organic layer.

15. The organic EL display device according to claim 1, wherein
the laminated auxiliary line has the same structure as that of the lower electrode.

* * * * *